United States Patent
Ozaki

(10) Patent No.: US 7,462,898 B2
(45) Date of Patent: Dec. 9, 2008

(54) SEMICONDUCTOR DEVICE HAVING CAPACITOR WITH UPPER ELECTRODE OF CONDUCTIVE OXIDE AND ITS MANUFACTURE METHOD

(75) Inventor: Yasutaka Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/296,459

(22) Filed: Dec. 8, 2005

(65) Prior Publication Data

US 2006/0273368 A1 Dec. 7, 2006

(30) Foreign Application Priority Data

Jun. 7, 2005 (JP) .............................. 2005-167331

(51) Int. Cl.
*H01L 29/76* (2006.01)
*H01L 29/94* (2006.01)

(52) U.S. Cl. ..................... 257/295; 257/296; 257/306

(58) Field of Classification Search ......... 257/295–296, 257/300, 306
See application file for complete search history.

(56) References Cited

U.S. PATENT DOCUMENTS 6,927,124 B2 * 8/2005 Suzuki ........................ 438/250

FOREIGN PATENT DOCUMENTS

| JP | 2760490 | 3/1998 |
|---|---|---|
| JP | 2000-235978 | 8/2000 |
| JP | 2000-332105 | 11/2000 |
| JP | 2001-127262 | 5/2001 |

* cited by examiner

*Primary Examiner*—Theresa T Doan
(74) *Attorney, Agent, or Firm*—Westerman, Hattori, Daniels & Adrian, LLP.

(57) ABSTRACT

A ferroelectric capacitor is formed above a substrate and made of a lamination of a lower electrode, a capacitor ferroelectric film and an upper electrode stacked in this order. The upper electrode is made of conductive oxide and has such an oxygen concentration distribution as an oxygen concentration in a lower layer region of the upper electrode becomes lower than an oxygen concentration in an upper layer region. An interlayer insulating film covers the ferroelectric capacitor. A via hole is formed through the interlayer insulating film and reaches a position deeper than an upper surface of the upper electrode. The via hole is stopped at a position shallower than a position at which the oxygen concentration of the upper electrode becomes maximum. A conductive member contacts the upper electrode on a bottom of the via hole.

7 Claims, 8 Drawing Sheets

Contact Resistance Between Upper Electrode and Plug

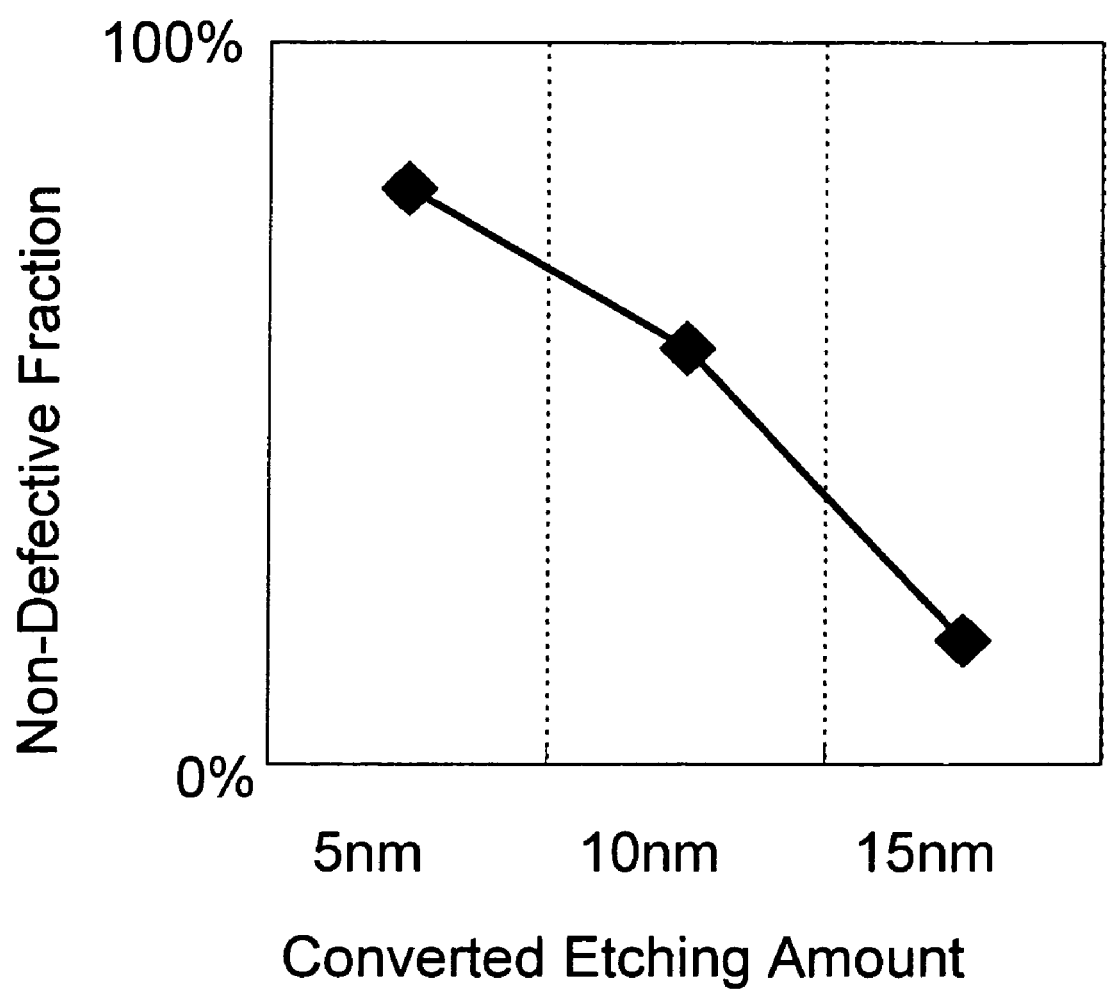

SEMICONDUCTOR DEVICE HAVING CAPACITOR WITH UPPER ELECTRODE OF CONDUCTIVE OXIDE AND ITS MANUFACTURE METHOD

CROSS REFERENCE TO RELATED APPLICATION

This application is based on and claims priority of Japanese Patent Application No. 2005-167331 filed on Jun. 7, 2005, the entire contents of which are incorporated herein by reference.

BACKGROUND OF THE INVENTION

A) Field of the Invention

The present invention relates to a semiconductor device and its manufacture method, and more particularly to a semiconductor device having ferroelectric capacitors whose upper electrodes are made of conductive oxide and its manufacture method.

B) Description of the Related Art

Ferroelectric memories have drawn attention as non-volatile memories which retain stored data even if a power is turned off. A ferroelectric memory is made of a combination of a MOS transistor and a ferroelectric capacitor whose dielectric film is made of ferroelectric material. Data are stored in the ferroelectric memory as a direction of spontaneous polarization in a ferroelectric film.

With reference to FIGS. 8A to 8C, description will be made on a ferroelectric capacitor manufacture method disclosed in JP-A-2001-127262.

As shown in FIG. 8A, above the surface of an interlayer insulating film formed on a substrate 100, a ferroelectric capacitor is formed which is constituted of a lower electrode 101, a capacitor ferroelectric film 102 and an upper electrode 103. The lower electrode 101 has a two-layer structure of a Ti film and a Pt film stacked in this order from the bottom. The capacitor ferroelectric film 102 is made of ferroelectric material such as (Pb, Zr)TiO$_3$ (hereinafter denoted as "PZT") and (Pb, Zr)(Ti, La)O$_3$ (hereinafter denoted as "PLZT"). The upper electrode 103 is made of iridium oxide, and a lower layer region 103A has a higher oxygen concentration than that of an upper layer region 103B.

The upper electrode 103 having the two-layer structure can be formed, for example, by sputtering an Ir metal target by plasma of a mixture gas of oxygen and argon. At a plasma generation DC power of 1 kW, the lower layer region 103A is formed having a relatively high oxygen concentration, and at a raised DC power of 2 kW, the upper layer region 103B is formed having a relatively low oxygen concentration. By lowering the oxygen concentration of the upper layer region 103B, it is possible to suppress abnormal growth of giant crystalline grains.

An interlayer insulating film 105 of silicon oxide is formed on the substrate 1, covering the ferroelectric capacitor.

As shown in FIG. 8B, the interlayer insulating film 105 is dry-etched to form via holes 110 and 111. A portion of the upper electrode 103 is exposed on the bottom of the via hole 110, and a portion of the lower electrode 101 is exposed on the bottom of the other via hole 111. After the via holes 110 and 111 are formed, heat treatment is performed for 60 minutes at 550° C. in an oxygen atmosphere to undo defects generated in the capacitor ferroelectric film 102 during dry etching.

As shown in FIG. 8C, a TiN film 115 is formed covering the inner walls of the via holes 110 and 111 and the surface of the interlayer insulating film 105. The TiN film 115 is patterned to form a local wiring pattern.

It is preferable to clean the surfaces of the upper and lower electrodes 103 and 101 exposed on the bottoms of the via holes 110 and 111 shown in FIG. 8C, in order to obtain good electric contacts at the interface between the upper electrode 103 and TiN film 115 and at the interface between the lower electrode 101 and TiN film 115. For example, this cleaning is performed by exposing the substrate surface to argon plasma.

The present inventor has found that as the substrate surface is cleaned, a contact resistance between the upper electrode 103 and TiN film 115 increases in some cases.

SUMMARY OF THE INVENTION

An object of this invention is to provide a semiconductor device and its manufacture method capable of preventing an increase in a contact resistance between an upper electrode and a conductive film formed on the upper electrode during a process of cleaning the surface of an exposed upper electrode.

According to one aspect of the present invention, there is provided a semiconductor device comprising: a ferroelectric capacitor formed above a substrate and made of a lamination of a lower electrode, a capacitor ferroelectric film and an upper electrode stacked in this order, the upper electrode being made of conductive oxide and having such an oxygen concentration distribution as an oxygen concentration in a lower layer region of the upper electrode becomes lower than an oxygen concentration in an upper layer region; an interlayer insulating film covering the ferroelectric capacitor; a via hole formed through the interlayer insulating film and reaching a position deeper than an upper surface of the upper electrode, the via hole being stopped at a position shallower than a position at which the oxygen concentration of the upper electrode becomes maximum; and a conductive member contacting the upper electrode on a bottom of the via hole.

According to another aspect of the present invention, there is provided a method of manufacturing a semiconductor device comprising steps of: forming a ferroelectric capacitor above a substrate, the ferroelectric capacitor being made of a lamination of a lower electrode, a capacitor ferroelectric film and an upper electrode stacked in this order, the upper electrode being made of conductive oxide and having such an oxygen concentration distribution as an oxygen concentration in a lower layer region of the upper electrode becomes lower than an oxygen concentration in an upper layer region; covering the ferroelectric capacitor with an interlayer insulating film; forming a via hole through the interlayer insulating film, the via hole partially exposing the upper electrode; cleaning a surface of the upper electrode by etching the upper electrode exposed on a bottom of the via hole, to a depth shallower than a depth at which the oxygen concentration in the upper electrode becomes maximum; and forming a conductive member contacting the surface of the upper electrode exposed on the bottom of the via hole.

Since the conductive member contacts the upper electrode at the position at which the oxygen concentration is relatively low, it is possible to suppress the conductive member from being oxidized by oxygen in the upper electrode. It is therefore possible to prevent an increase in the contact resistance to be caused by oxidation of the conductive member.

BRIEF DESCRIPTION OF THE DRAWINGS

FIG. 5 is a graph showing a non-defective fraction of ferroelectric memories manufactured under the conditions of converted etching amounts of 5 nm, 10 nm and 15 nm.

DESCRIPTION OF THE PREFERRED EMBODIMENTS

Figure 1:
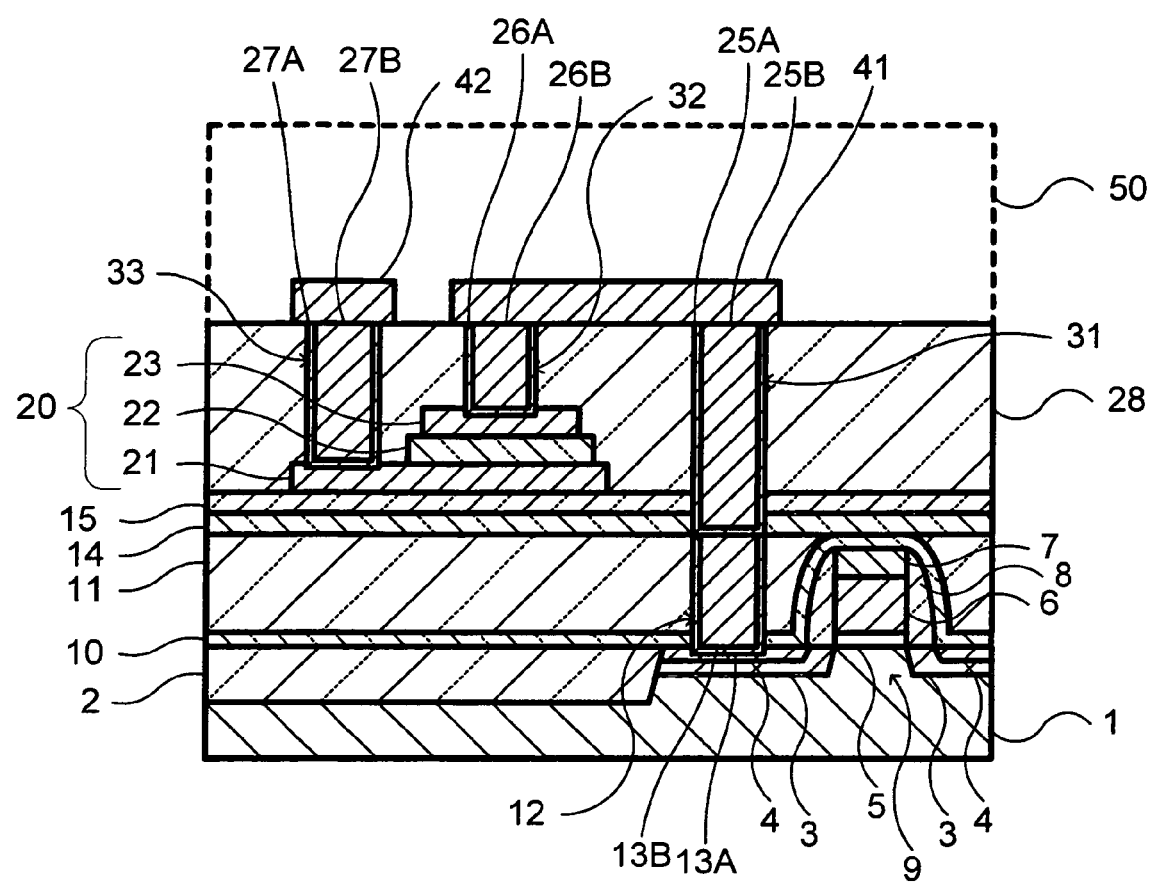
FIG. 1 is a cross sectional view of a semiconductor device according to an embodiment and a comparative example.

FIG. 1 is a cross sectional view of a semiconductor device according to the embodiment and comparative example. An element isolation insulating film 2 is formed by shallow trench isolation (STI) in a partial surface layer of a semiconductor substrate 1 made of silicon. A MOS transistor 9 is formed in an active region defined by the element isolation insulating film 2. The MOS transistor 9 is constituted of a gate insulating film 5, a gate electrode 6, source and drain diffusion layers 3 and sidewall spacers 8. A cobalt silicide ($CoSi_2$) film 4 is formed on the surfaces of the source and drain diffusion layers 3, and a cap film 7 of cobalt silicide is formed on the upper surface of the gate electrode 6.

A silicon oxynitride film 10 is formed on the substrate, covering the MOS transistor 9. An interlayer insulating film 11 of silicon oxide is formed on the silicon oxynitride film 10. The surface of the interlayer insulating film 11 is planarized by chemical mechanical polishing (CMP) or the like. The silicon oxynitride film 10 prevents the gate insulating film 5 from being deteriorated by moisture while the interlayer insulating film 11 is formed.

A via hole 12 is formed through the interlayer insulating film 11 and silicon oxynitride film 10. A portion of the silicide film 4 is exposed on the bottom of the via hole 12. An underlying layer 13A of TiN or the like covers the inner wall of the via hole 12, and a plug 13B of tungsten (W) or the like fills the via hole 12.

An antioxidizing film 14 of silicon nitride is formed on the interlayer insulating film 11 and an orientation improving insulating film 15 of silicon oxide is formed on the antioxidizing film 14. A ferroelectric capacitor 20 is formed on a partial surface of the orientation improving insulating film 15. The ferroelectric capacitor 20 has a lamination structure of a lower electrode 21, a capacitor ferroelectric film 22 and an upper electrode 23 stacked in this order from the substrate side.

The lower electrode 21 has a two-layer structure of a titanium (Ti) film and a platinum (Pt) film stacked in this order from the bottom. The capacitor ferroelectric film 22 is made of ferroelectric oxide such as PZT and PLZT. The upper electrode 23 is made of iridium oxide. A second interlayer insulating film 28 of silicon oxide is formed on the orientation improving insulating film 15, covering the ferroelectric capacitor 20. The surface of the interlayer insulating film 28 is planarized by CMP or the like.

Via holes 31, 32 and 33 are formed through the interlayer insulating film 28. The via hole 31 extends also into the orientation improving insulating film 15 and antioxidizing film 14 and reaches the upper surface of the plug 13B. The via hole 32 reaches the upper electrode 23, and the via hole 33 passes by the upper electrode 23 and capacitor ferroelectric film 22 and reaches the lower electrode 21.

Underlying layers 25A, 26A and 27A of TiN cover the inner walls of the via holes 31 to 33, and plugs 25B, 26B and 27B of W fill the via holes 31 to 33. Wirings 41 and 42 are formed on the interlayer insulating film 28. The plugs 13B and 25B, wiring 42 and plug 26B connect the source diffusion layer 3 of the MOS transistor 9 to the upper electrode 23 of the ferroelectric capacitor 20. The wiring 42 is connected to the lower electrode 21 via the plug 27B.

An upper structure 50 is formed on the wirings 41 and 42, the upper structure including a multi-layer wiring structure having interlayer insulating films and wirings, a protective film of polyimide and the like.

Next, description will be made on a manufacture method for the semiconductor device according to the embodiment and comparative example. Necessary p-type and n-type wells are formed in a surface layer of the semiconductor substrate 1. The element isolation insulating film 2 is formed by STI. The MOS transistor 9 is formed in an active region surrounded by the element isolation insulating film 2 by well-known technologies such as photolithography, etching, and ion implantation.

The silicon oxynitride film 10 is formed on the whole substrate surface to a thickness of 200 nm by chemical vapor deposition (CVD), the silicon oxynitride film covering the MOS transistor 9. A silicon oxide film having a thickness of about 1000 nm is formed on the silicon oxynitride film, and the surface thereof is planarized by CMP. The silicon oxynitride film 10 deposited on the gate electrode 6 functions as a stopper of CMP. In this manner, the first interlayer insulating film 11 with the planarized surface is formed.

The via hole 12 is formed through the interlayer insulating film 11 and silicon oxynitride film 10. The Ti layer and TiN layer are sequentially formed covering the inner wall of the via hole and the upper surface of the interlayer insulating film 11. The W layer is deposited on the TiN layer fill the via hole 12. Unnecessary W, TiN and Ti layers are removed by CMP to leave the underlying layer 13A made of two Ti and TiN layers and the plug 13B made of W.

The antioxidizing film 14 having a thickness of 100 nm and made of silicon nitride is formed on the interlayer insulating film 11 by CVD. The orientation improving insulating film 15 having a thickness of 130 nm and made of silicon oxide is formed on the antioxidizing film 14 by CVD.

With reference to FIGS. 2A to 2F, description will be made on a method of forming the ferroelectric capacitor 20 and plugs 25B, 26B and 27B.

Figure 2A:
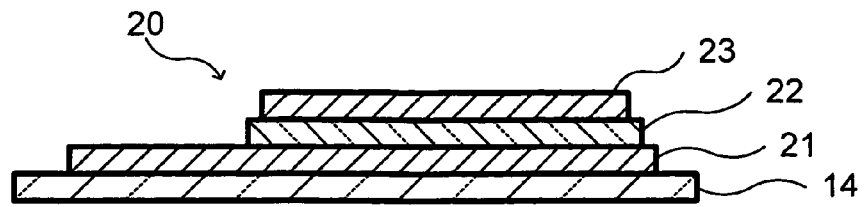
FIGS. 2A to 2F are cross sectional views illustrating processes of manufacturing a ferroelectric capacitor and plugs to be connected to the capacitor of the semiconductor device according to the embodiment and comparative example.

As shown in FIG. 2A, two layers, the Ti layer having a thickness of 20 nm and the Pt layer having a thickness of 175 nm constituting the lower electrode 21, are formed on the orientation improving insulating film 15 by sputtering. The orientation improving insulating film 15 functions to improve the orientation of the Ti film and Pt film. The ferroelectric oxide film having a thickness of 200 nm and made of PZT, PLZT or the like constituting the capacitor ferroelectric film 22 is formed on the Pt film by sputtering. After the ferroelectric oxide film is formed, rapid thermal annealing is performed for 20 seconds at 725° C. in an oxygen atmosphere. This heat treatment crystallizes PZT, PLZT or the like to compensate for lost oxygen.

An iridium oxide film constituting the upper electrode 23 is formed on the ferroelectric oxide film. In the following, a method of forming the iridium oxide film will be described. An Ir metal target is sputtered to form an iridium oxide film having a thickness of 75 nm under the conditions of a chamber pressure of 0.8 Pa, an oxygen flow rate of 100 sccm, an argon flow rate of 100 sccm, a DC power of 1 kW, and a substrate temperature of a room temperature. Thereafter, at a raised DC power of 2 kW, an iridium oxide film having a thickness of 125 nm is formed.

The composition ratio between Ir and O of the iridium oxide film formed at the DC power of 1 kW is about 1:2. The composition ratio between Ir and O of the iridium oxide film formed at the raised DC power of 2 kW is about 1:1.4. The upper electrode 23 has a two-layer structure of the iridium oxide film having a relatively high oxygen concentration and the iridium oxide film having a relatively low oxygen concentration.

By raising the DC power during the film forming process, the iridium oxide film can be formed which has the upper layer region of a lower oxygen concentration than that of the lower layer region. By lowering the oxygen concentration during the film forming process, it is possible to suppress abnormal growth of giant crystalline grains.

By pattering the iridium oxide film, ferroelectric oxide film, Pt film and Ti film, the ferroelectric capacitor 20 can be formed which is constituted of the upper electrode 23, capacitor ferroelectric film 22 and lower electrode 21.

Figure 2B:
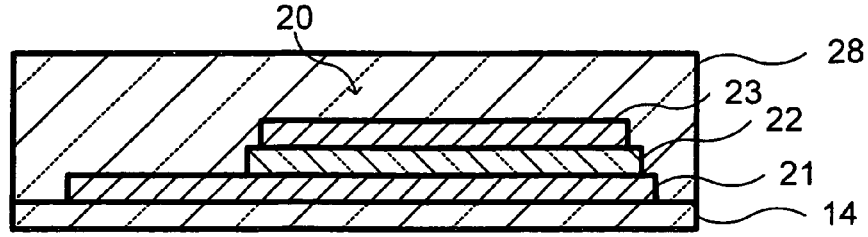

As shown in FIG. 2B, the interlayer insulating film 28 of silicon oxide is formed on the orientation improving insulating film 14, covering the ferroelectric capacitor 20. For example, the interlayer insulating film 28 can be formed by atmospheric pressure chemical vapor deposition (atmospheric pressure CVD) using tetraethylorthosilicate (TEOS) and ozone ($O_3$).

Figure 2C:
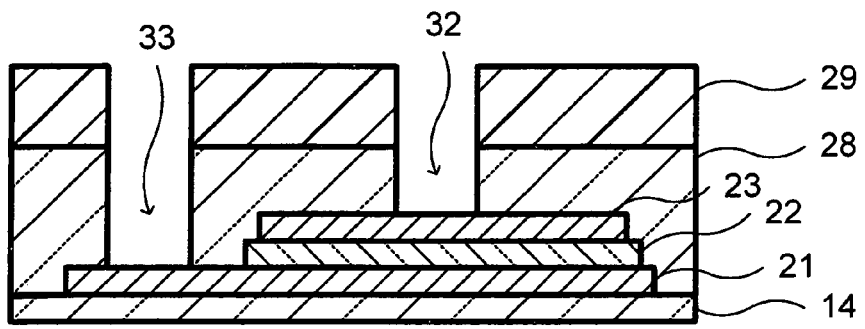

As shown in FIG. 2C, a resist film 29 is formed on the interlayer insulating film 28. The resist film is exposed and developed to form openings corresponding to the via holes 32 and 33. By using the resist film 29 as an etching mask, the interlayer insulating film 28 is etched to form the via hole 32 reaching the surface of the upper electrode 23 and the via hole 33 reaching the surface of the lower electrode 21. The other via hole 31 shown in FIG. 1 is also formed at the same time. For example, in etching the interlayer insulating film 28, dry etching using fluorine-containing gas may be adopted.

Figure 2D:
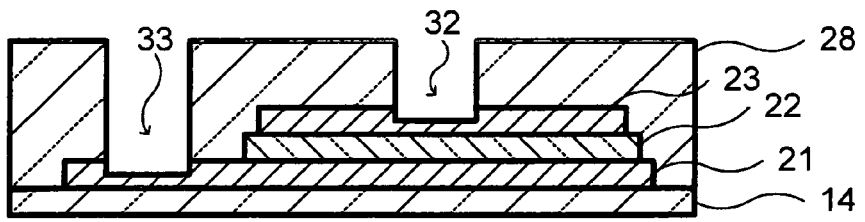

As shown in FIG. 2D, after the resist film 29 is removed, the substrate surface is exposed to argon plasma to clean the surface of the upper electrode 23 exposed on the bottom of the via hole 32 and the surface of the lower electrode 21 exposed on the bottom of the via hole 33. For example, this cleaning is performed under the conditions of an argon gas flow rate of 18 sccm, an RF power of 300 W, a pressure of 59 mPa (0.44 mTorr) and a substrate temperature of a room temperature. This cleaning process partially etches the upper electrode 23 exposed on the bottom of the via hole 32, forming a step between the region of the upper electrode covered with the interlayer insulating film 28 and the region of the upper electrode exposed on the bottom of the via hole 32. Similarly, a step is formed on the upper surface of the lower electrode 21.

Figure 2E:
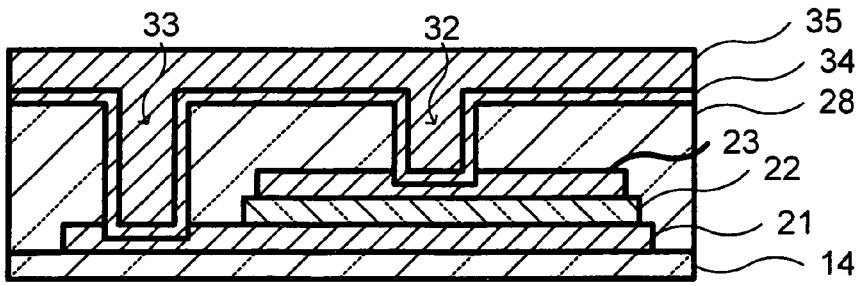

As sown in FIG. 2E, the TiN film 34 is formed by long throw sputtering, covering the inner walls of the via holes 32 and 33 and the upper surface of the interlayer insulating film 28. A W film 35 is formed on the substrate whole surface by CVD, completely fills the via holes 32 and 33.

Figure 2F:
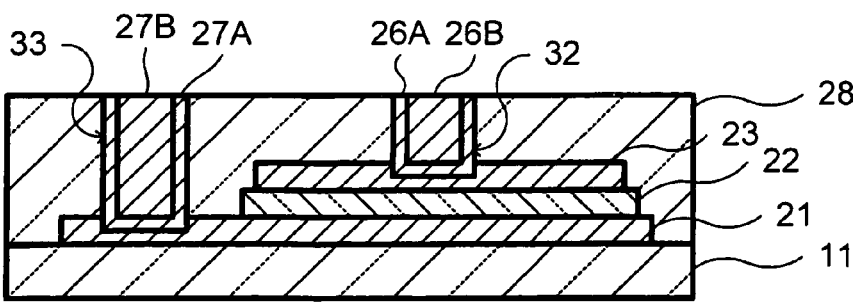

As shown in FIG. 2F, unnecessary portions of the TiN film 34 and W film 35 are removed by CMP to leave the underlying layer 26A of TiN covering the inner wall of the via hole 32 and the W plug 26B filling the via hole 32. Similarly, the underlying layer 27A and plug 27B remain in the via hole 33.

Description will continue reverting to FIG. 1. The wirings 41 and 42 are formed on the interlayer insulating film 28. By alternately repeating a process of forming an interlayer insulating film and a process of forming wirings, a multi-layer wiring structure is formed. After the multi-layer wiring structure is formed, heat treatment is performed in order to stabilize the transistor characteristics. For example, this heat treatment is performed for 30 minutes at 400° C. in a mixture gas of nitrogen and hydrogen (hydrogen concentration of 3%). A protective film of polyimide is formed on the multi-layer wiring structure. Heat treatment for curing polyimide is performed, for example, for 60 minutes at 380° C. in the atmospheric air.

A plurality of samples were formed by varying the process time of the cleaning process using argon plasma illustrated in FIG. 2D to be executed after the via holes 32 and 33 are formed. Measured were an electric resistance between the upper electrode 23 and W plug 26B and a switching charge quantity (Qsw) of the ferroelectric capacitor 20.

Figure 3:
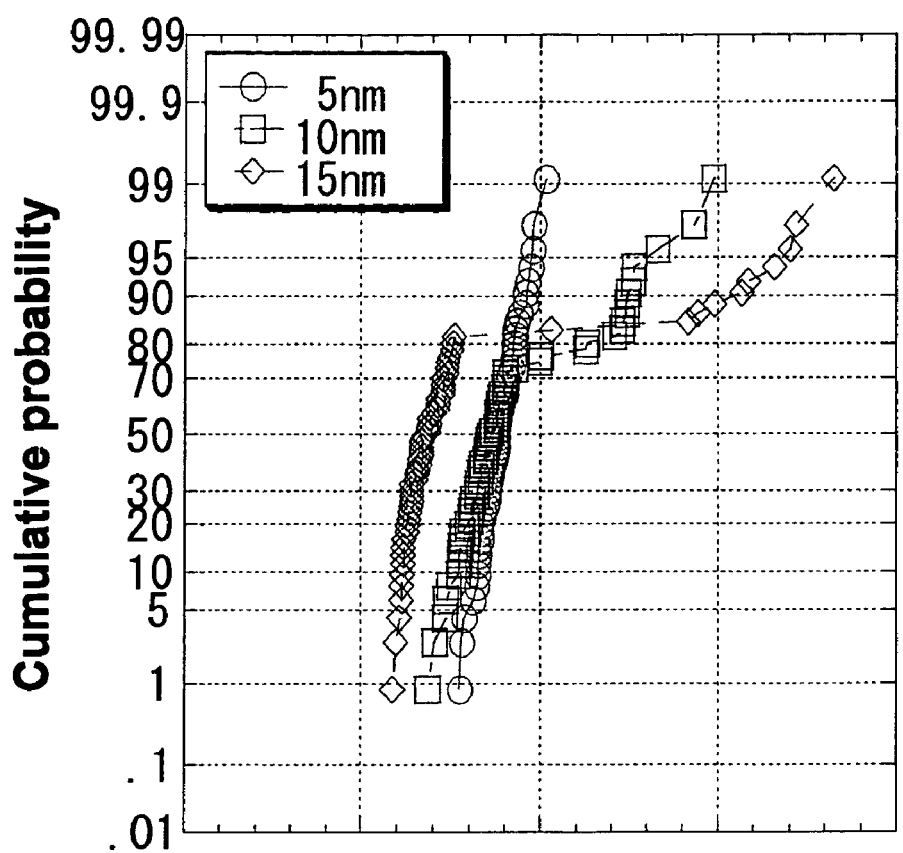
FIG. 3 is a graph showing a variation in electric resistances between the upper electrode and plug connected to the upper electrode of the ferroelectric capacitor of each semiconductor device according to the embodiment and comparative example.

FIG. 3 shows the measurement results of the electric resistance. The abscissa of FIG. 3 represents an electric resistance between the upper electrode 23 and W plug 26B in an arbitrary unit, and the ordinate represents a cumulative probability in the unit of "%". Circle symbols, square symbols and rhombus symbols shown in FIG. 3 indicate cumulative probabilities of samples which were formed at the argon plasma exposure times which are the same as the times taken to etch a thermally oxidized silicon film by 5 nm, 10 nm and 15 nm, respectively. These cleaning conditions are called a 5 nm converted etching amount condition, a 10 nm converted etching amount condition, and a 15 nm converted etching amount condition, respectively.

It can be understood that the samples formed under the 10 nm converted etching amount condition and the 15 nm converted etching amount condition showed the electric resistances at the via holes of 20 to 30% considerably higher than those at the other via holes. In contrast, the samples formed under the 5 nm converted etching amount condition showed a small variation in electric resistances and there are no samples having a very high electric resistances.

Figure 4:
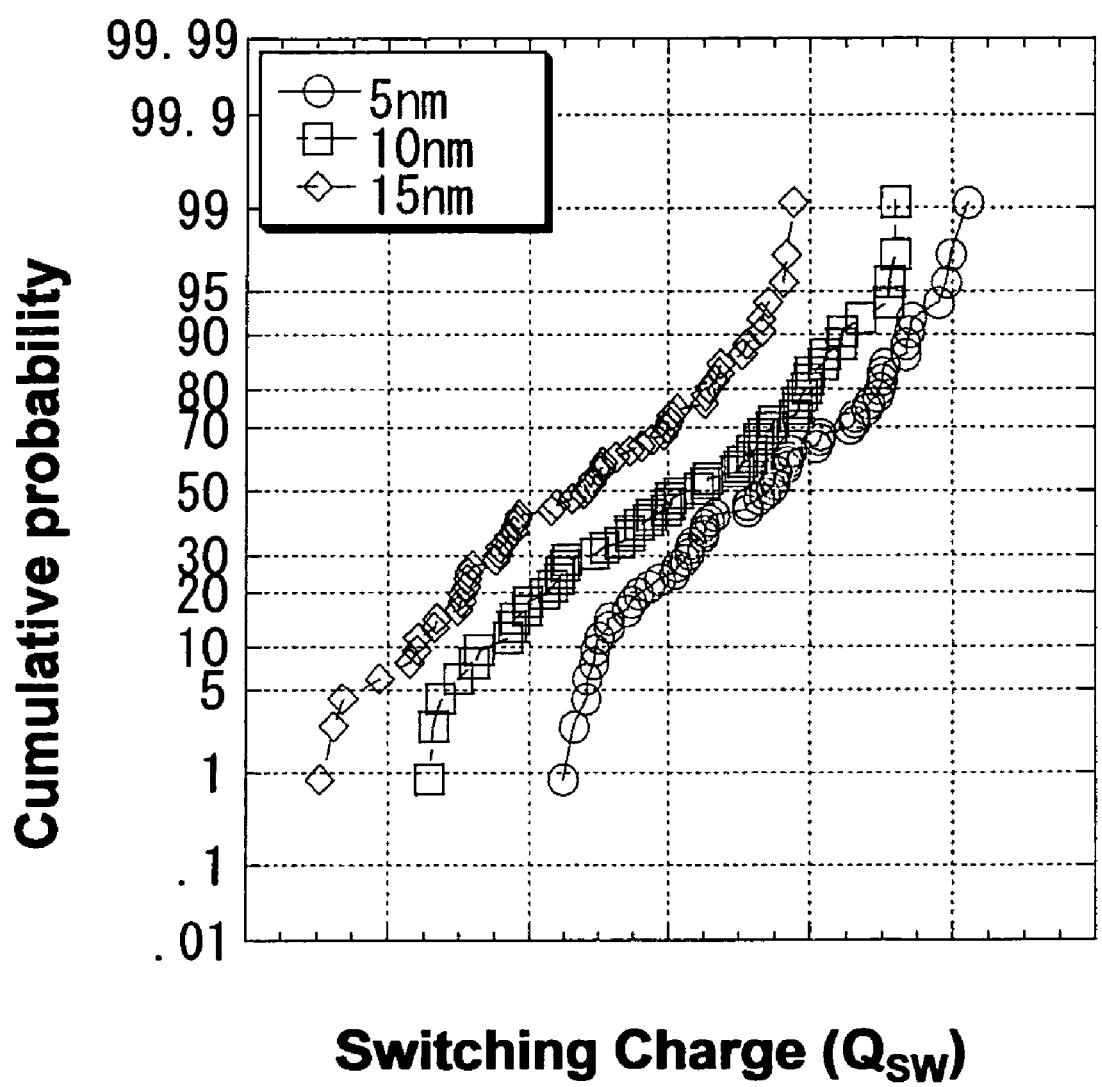
FIG. 4 is a graph showing a variation in switching charge amounts of the ferroelectric capacitor of each semiconductor device according to the embodiment and comparative example.

FIG. 4 shows the measurement results of Qsw of the ferroelectric capacitors 20. The abscissa represents Qsw in an arbitrary unit and the ordinate represents a cumulative probability in the unit of "%". It can be understood that as the converted etching amount becomes large, Qsw becomes small.

FIG. 5 shows a non-defective fraction of non-volatile memory samples of three types having the converted etching amounts of 5 nm, 10 nm and 15 nm. It can be understood that as the converted etching amount becomes large, the non-defective fraction decreases.

It can be understood from the results shown in FIGS. 3 to 5 that it is preferable to set the converted etching amount to about 5 nm rather than to 10 to 15 nm.

In the following, studies will be made on the reason why the electric resistance between the upper electrode 23 and W plug 26B increases as the converted etching amount is made large.

Figure 6A:
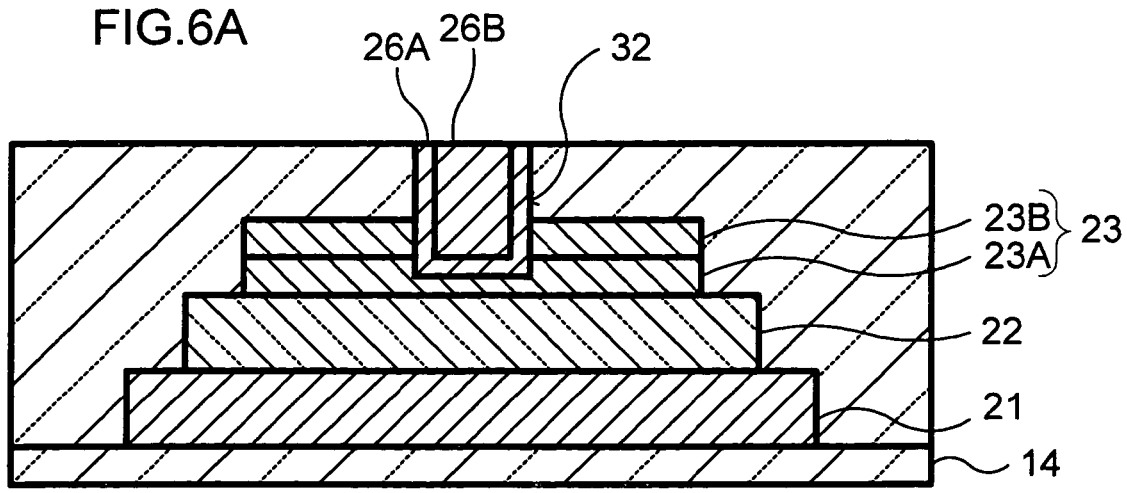
FIG. 6A is a cross sectional view of a ferroelectric capacitor and a plug according to the comparative example.

FIG. 6A is an enlarged cross sectional view showing a connection region between the upper electrode 23 and W plug 26B of the ferroelectric capacitor 20. The upper electrode 23 can be divided into a lower layer region 23A having a relatively high oxygen concentration and an upper layer region 23B having a relatively low oxygen concentration. As the converted etching amount is increased, the bottom of the via hole 32 reaches the lower layer region 23A. Therefore, the underlying layer 26A of TiN directly contacts the lower layer region 23A. Since the lower layer region 23A has a relatively high oxygen concentration, it can be considered that an oxidation reaction occurs at the interface between the underlying layer 26A and lower layer region 23A and the electric resistance therebetween becomes high, during the heat treatment process of recovering the transistor characteristics and the heat treatment process of curing polyimide.

Figure 6B:
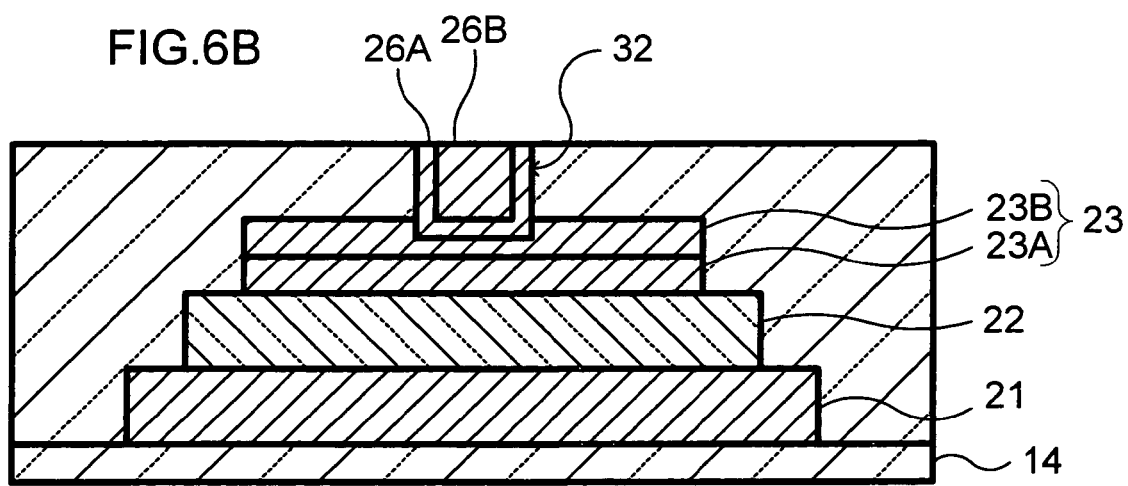
FIG. 6B is a cross sectional view of a ferroelectric capacitor and a plug according to the embodiment.

As shown in FIG. 6B, if the converted etching amount is about 5 nm, the bottom of the via hole 32 stops in the upper layer region 23B of the upper electrode 23 and does not reach the lower layer region 23A. Since the upper layer region 23B has a relatively low oxygen concentration, an oxidation reaction is hard to occur at the interface between the underlying layer 26A and upper layer region 23B. It can therefore be considered that the electric resistance therebetween can be maintained low even after the subsequent heat treatment processes.

As described above, in the case that the upper electrode 23 includes two layers, the lower layer region 23A having a relatively high oxygen concentration and the upper layer region 23B having a relatively low oxygen concentration, it is preferable to adopt the structure that the underlying layer 26A in the via hole 32 contacts the upper layer region 23B. The effects of maintaining the electric resistance low can be expected greatly when the oxygen concentration of the upper layer region 23B is 0.8 time or lower than the oxygen concentration of the lower layer region 23A.

Next, studies will be made on the reason why Qsw becomes small as the converted etching amount is made large. As the converted etching amount is made large, a distance between the bottom of the via hole 32 and the upper surface of the capacitor ferroelectric film 22 becomes short. It can therefore be considered that the degree of degrading the capacitor ferroelectric film 22 while the via hole 32 is formed, becomes large so that Qsw decreases. Stopping the etching process of forming the via hole 32 at the inside of the upper layer region 23B of the upper electrode 23 also provides the effects of suppressing the capacitor ferroelectric film 22 from being degraded.

In the above-described embodiment, although the upper electrode 23 is clearly divided into the lower layer region 23A and upper layer region 23B, a border between the regions may be unclear.

Figure 7:
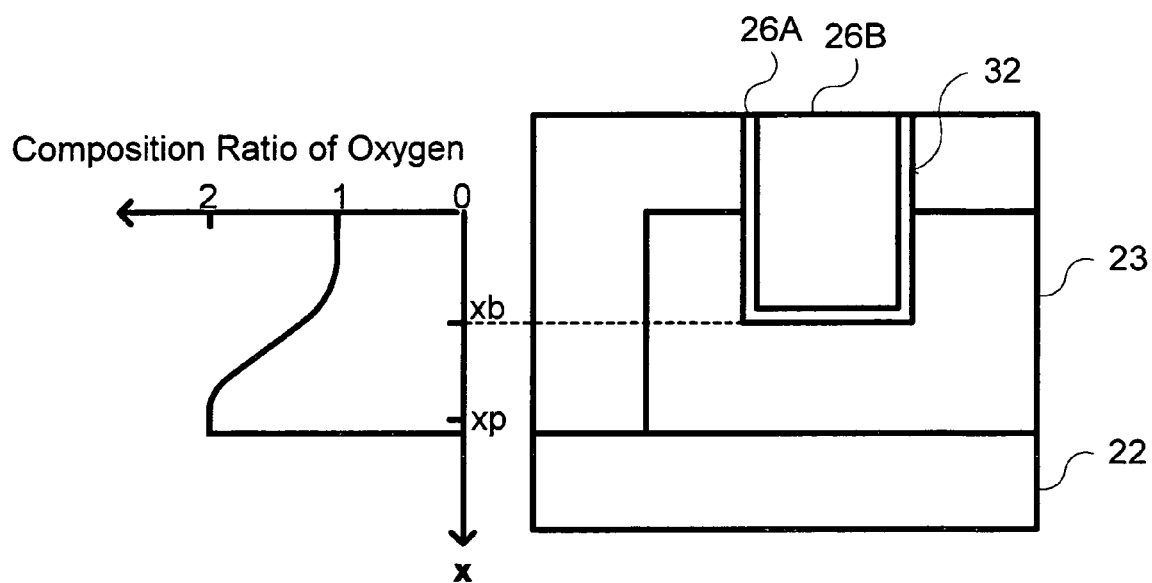
FIG. 7 is a graph showing an example of the distribution of an oxygen concentration relative to a depth direction in an upper electrode and a schematic cross sectional view of the upper electrode and plug.
Figure 8A:
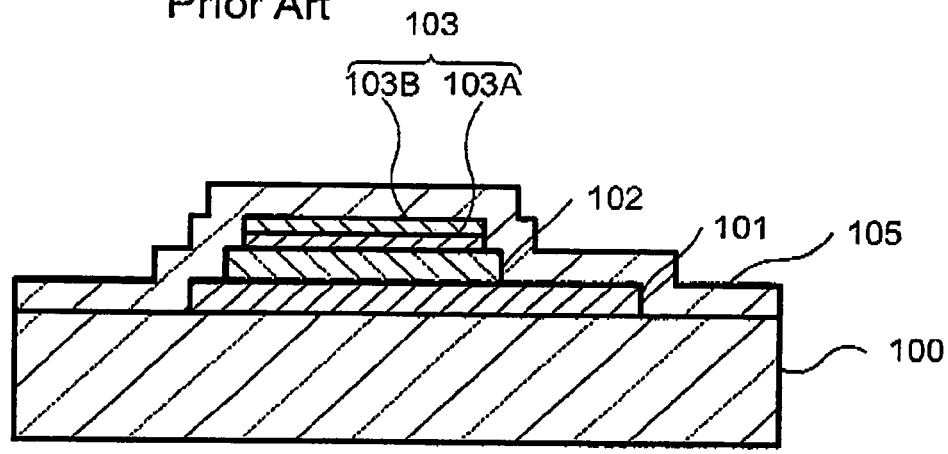
FIGS. 8A to 8C are cross sectional views illustrating intermediate processes of a conventional semiconductor device manufacture method.
Figure 8B:
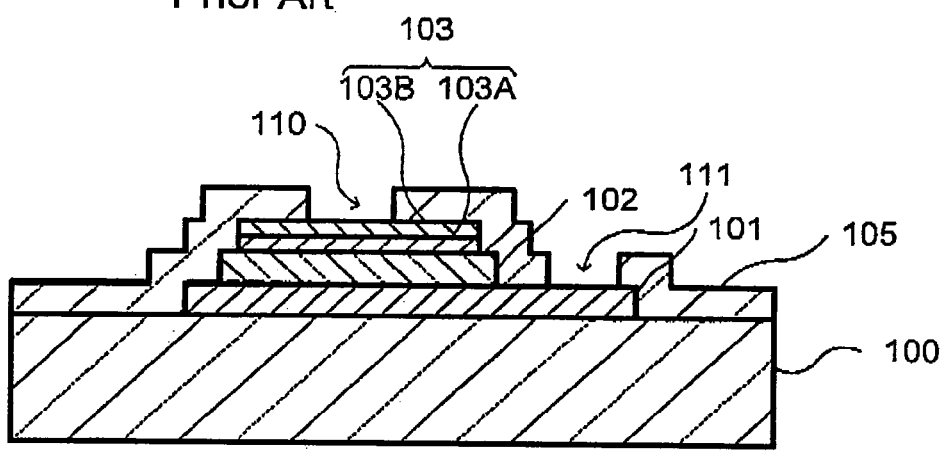
Figure 8C:
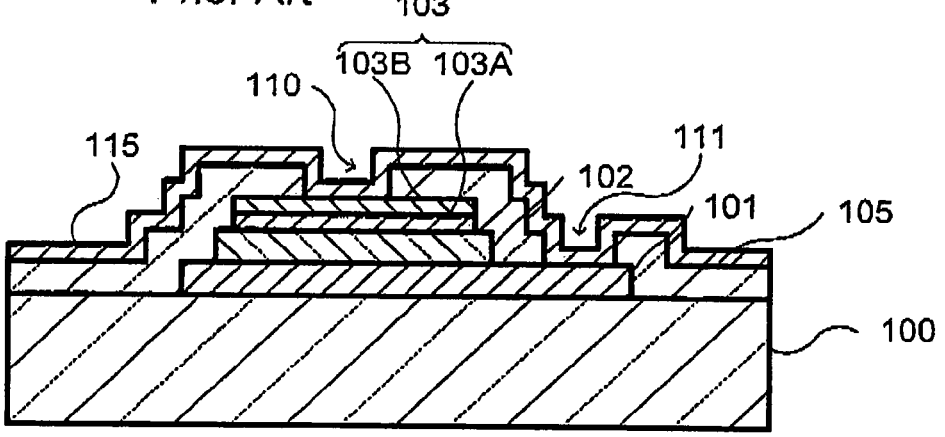

FIG. 7 shows an example of the distribution of an oxygen concentration in a depth direction in the upper electrode 23. An x-axis is set to the depth direction in the upper electrode 23, and x-coordinate of the upper surface of the upper electrode 23 is set to zero. The oxygen concentration at the position of x=0 is about 1.0, and as the depth becomes deeper, the oxygen concentration rises continuously. The oxygen concentration takes its maximum value of 2.0 at a depth xp near the interface between the upper electrode 23 and capacitor ferroelectric film 22. This oxygen concentration distribution can be obtained by gradually raising the plasma generation DC power from 1 kW.

The via hole 32 reaches a depth xb shallower than the depth xp at which the oxygen concentration becomes maximum. The underlying layer 26A contacts the upper electrode 23 at the depth xb. In the state that the oxygen concentration in the upper electrode 23 has the distribution that the oxygen concentration in the upper layer region is lower than that in the lower layer region, the via hole 32 stops at the depth xb shallower than the depth xp at which the oxygen concentration becomes maximum so that it is possible to prevent an increase in the contact resistance between the underlying layer 26A and upper electrode 23. In order to obtain the maximum effects of preventing an increase in the contact resistance, it is preferable to adopt the structure that the oxygen concentration at the depth xb becomes 0.8 time or lower than that at the depth xp.

In the above-described embodiment, although the upper electrode 23 is made of iridium oxide, it may be made of other conductive oxide material containing strontium, ruthenium or lanthanum.

In the above-described embodiment, although the underlying layer 26A contacting the upper electrode 23 is made of TiN, it may be made of other conductive material whose resistivity increases when it is oxidized, with the expected effects of suppressing an increase in the contact resistance between the upper electrode and underlying layer. Other conductive materials, not limiting to the material whose resistivity increases when it is oxidized, may also be used with the effects of suppressing the capacitor ferroelectric film 22 from being degraded.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor device comprising:
    a ferroelectric capacitor formed over a substrate and comprising a lamination of a lower electrode, a capacitor ferroelectric film and an upper electrode stacked in this order, the upper electrode being made of conductive oxide and having such an oxygen concentration distribution as an oxygen concentration in an upper layer region of the upper electrode becomes lower than an oxygen concentration in a lower layer region;
    an interlayer insulating film covering the ferroelectric capacitor;
    a via hole formed through the interlayer insulating film and reaching a position deeper than an upper surface of the upper electrode, the via hole being stopped at a position shallower than a position at which the oxygen concentration of the upper electrode becomes maximum; and
    a conductive member contacting the upper electrode on a bottom of the via hole.

2. The semiconductor device according to claim 1, wherein the conductive member is made of conductive material, resistivity of an oxide of the conductive member being higher than resistivity of the conductive material.

3. The semiconductor device according to claim 1, wherein the oxygen concentration in the upper electrode at a position contacting the conductive member is 0.8 times or lower than the oxygen concentration at a position at which the oxygen concentration becomes maximum.

4. The semiconductor device according to claim 1, wherein the upper electrode has two layers, the lower layer having a relatively high oxygen concentration and the upper layer having a relatively low oxygen concentration, and the conductive member contacting the upper layer region.

5. The semiconductor device according to claim 4, wherein the oxygen concentration in the upper layer region is 0.8 times or lower than the oxygen concentration in the lower layer region.

6. The semiconductor device according to claim 1, wherein the upper electrode contains one element selected from a group consisting of iridium, strontium, ruthenium and lanthanum.

7. The semiconductor device according to claim 1, wherein the conductive member is made of titanium nitride.

* * * * *